United States Patent [19]

Schonhorn et al.

[11] Patent Number: 4,483,898
[45] Date of Patent: Nov. 20, 1984

[54] LIQUIDS WITH REDUCED SPREADING TENDENCY

[75] Inventors: Harold Schonhorn, New Providence; Louis H. Sharpe, Morris Township, Morris County, both of N.J.

[73] Assignee: AT&T Bell Laboratories, Murray Hill, N.J.

[21] Appl. No.: 358,859

[22] Filed: Mar. 17, 1982

[51] Int. Cl.$^3$ .......................... B05D 5/12; B32B 25/00
[52] U.S. Cl. .................................... 428/356; 156/330;
427/82; 427/207.1; 428/355; 427/385.5;
428/413; 428/447; 428/448; 428/458; 428/463;
428/480; 428/522
[58] Field of Search ............... 427/82, 207.1, 385.5;
156/330; 428/413, 409, 447, 448, 480, 522, 458,
463, 356, 355

[56] References Cited

U.S. PATENT DOCUMENTS 4,134,456  3/1979  Inoue .................................... 29/588
4,238,528  12/1980  Angelo et al. ........................ 427/82

OTHER PUBLICATIONS

Bernett et al., "Prevention of Liquid Spreading or Creeping", in *Contact Angle, Wettability and Adhesion*, Advances in Chemistry Series, vol. 43, (1964), pp. 332-340.
Cottington et al., "Effect of Polar-Non-Nonpolar Additives on Oil Spreading on Solids, with Applications to Nonspreading Oils", in same book as above, pp. 341-354.
Zisman, W. A., "Relation of the Equilibrium Contact Angle to Liquid and Solid Constitution", in same book as above, pp. 1-50.

*Primary Examiner*—Norman Morgenstern
*Assistant Examiner*—Janyce A. Bell
*Attorney, Agent, or Firm*—Richard D. Laumann; Eugen E. Pacher

[57] ABSTRACT

The spreading of liquids, e.g., an epoxy resin, on a surface can be prevented or reduced if an inhibitor is added to the liquid. Inhibitors according to the invention have the generic formula $[CX_3-(CY_2)_n]_N-R$, where X is H or F, Y is H, F, or Cl, n is a number from about 1 to about 12, R is a carboxylic acid, an amide, a substituted amide, an amine, an alcohol, or an ester functionality, and N is 1, 2, or 3 if R is an alcohol or amine functionality, and 1 otherwise. The inhibitor typically has substantial solubility in at least one of the constituents of the liquid, and the liquid typically contains between about 0.05% and about 5% by weight of the inhibitor. Preferred inhibitors are perfluorooctanoic acid and 1H, 1H-pentadecafluorooctyl amine.

23 Claims, No Drawings

LIQUIDS WITH REDUCED SPREADING TENDENCY

FIELD OF THE INVENTION

The invention pertains to inhibitor-containing liquids having reduced spreading tendency on solid surfaces, and to methods for producing an article by means of such liquids.

BACKGROUND OF THE INVENTION

The spontaneous spreading of a liquid on a solid surface, that is to say, the wetting of a solid surface by a liquid, has been studied extensively. See, for instance, "Contact Angle, Wettability, and Adhesion," *Advances in Chemistry Series*, Volume 43, American Chemical Society, Washington, D.C. 1964, especially pages 1 through 49. As discussed there, spontaneous spreading occurs if the contact angle between liquid and solid goes to zero, and conversely, spontaneous spreading does not occur if this contact angle remains finite. The latter occurs when, loosely speaking, the surface free energy of the solid/liquid interface is less than or equal to the difference in surface free energy between the solid/vapor interface and the liquid/vapor interface. This relationship suggests that liquids will tend not to spread spontaneously on solid surfaces of suitably low surface free energy.

This theoretical understanding of the conditions under which wetting of solid surfaces by liquids occurs has made it possible to devise methods for the prevention or reduction of the spreading of liquids on surfaces. These methods have been categorized and discussed by M. K. Bernett and W. A. Zisman (op. cit., Chapter 24, pages 332–340). A first approach consists of appropriate modification of the solid surface to lower its critical surface tension of wetting. This can be done by means of an appropriate low energy surface coating. This approach was used in the invention that forms the basis of the copending U.S. patent application, Ser. No. 261,890, filed May 8, 1981 by Schonhorn and L. H. Sharpe, entitled "Prevention of Surface Mass Migration by Means of a Polymeric Surface Coating."

A second approach for preventing or reducing the spreading of a liquid on a solid surface, also discussed by Bernett and Zisman (ibid.) consists of addition of a selected solute, to be referred to as an "inhibitor," to the liquid. If an additive, while dispersed or dissolved in a liquid, can adsorb on a solid surface in contact with the liquid and form a thin layer thereon, with the resulting coated surface having a critical surface tension of wetting that is lower than the surface tension of the additive-containing liquid, then the liquid will not spread on the surface, and the additive is a potential inhibitor.

In a variant of the inhibitor method, also discussed by Bernett and Zisman (op. cit.), the additive is more volatile than the liquid and creates a surface tension gradient at the edge of the liquid drop that opposes the spontaneous spreading of the liquid. This application is concerned with the inhibitor approach and does not require creation of a surface tension gradient. The application will, therefore, not further discuss the gradient variant.

Methods for preventing or reducing the spreading of liquids have in the past been developed for, and applied to, oils. The discussion by Bernett and Zisman, cited above, is an example of such work. These authors recite classes of additives they find to be useful for preventing the spreading of liquids, namely fluorocarbon or silicone derivatives, fatty acids or other paraffinic polar compounds, or branched-chain or cyclic hydrocarbon derivatives, depending on the surface tension of the liquid (ibid, pp. 334–335). Other publications, for instance, R. L. Cottington et al, (op. cit., pages 341–354), deal exclusively with the spreading of oils on solids. Cottington et al report that effective adsorbable additives for the prevention of spreading of oils include the silicones, fluoroesters, amine-organic acid salts, high molecular weight organic acids, alcohols, or amines, and some oil-soluble soaps (op. cit., page 341), and teaches that the additive should have appreciable solubility in the base oil over the temperature range contemplated, should adsorb promptly on the surface from the leading edge to give a film from which the oil retracts, that it should lower the surface tension of the base oil by less than 5 dynes/cm, that it should be more volatile than the base oil, and that it should not be altered by hydrolysis or oxidation in such a way as to increase the surface free energy of the adsorbed film. The prior art does not seem to have given consideration to inhibitors potentially capable of prevention of spreading of oils or other liquids at elevated temperatures.

Oils are not the only liquids whose spreading tendency is of technological concern. In the manufacture of semiconductor devices it is, for instance, found that conductive adhesives, used for bonding a semiconductor component, e.g., a chip, to, e.g., a metallized substrate, are subject to spreading. Such spreading can have quite deleterious results. For instance, it can result in coating of bonding pads used for connections to external circuitry and consequent reduction of the strength and reliability of wire connections made thereto, as well as in other difficulties in later processing steps due to surface contamination by the spreading liquid. Similarly, in hybrid integrated circuits the spreading of screen-printed liquid fine line patterns can be a problem. Also, the spreading of a transparent encapsulant of an electrooptical device, e.g., a LED chip, can, for instance, result in a change of curvature of the encapsulant surface, with attendant change of the optical properties of the device. These examples indicate the variety of situations in which the spreading of liquids can occur and have undesirable consequences.

A method for preventing spreading of liquid is disclosed in U.S. Pat. No. 4,143,456, issued Mar. 13, 1979 to K. Inoue, entitled "Semiconductor Device Insulation Method." The method comprises applying a low surface free energy insulating resin film around a semiconductor chip on a circuit board by means of a printing technique, thereby confining a liquid, e.g., an uncured resin, to the space defined by the printed pattern.

Another method for prevention of liquid spreading is disclosed in the copending application, cited above. The method comprises coating of the substrate with a thin, typically a monomolecular, layer of an organic polymer, the layer having a low critical surface tension of wetting. Both these prior art methods thus require an added manufacturing step, namely, coating of all or a selected region of the substrate. A method for the prevention of liquid spreading that does not require such additional manufacturing steps is thus of economic significance, especially a method capable of the prevention of spreading at elevated temperature.

SUMMARY OF THE INVENTION

Disclosed is a material combination comprising an effective amount of an inhibitor. Disclosed also is a method for producing an article, and articles produced by means of the method, with the method comprising contacting a surface with a liquid containing an effective amount of an inhibitor.

Inhibitors according to the invention are selected from the class nominally defined by the formula $[CX_3—(CY_2)_n]_N—R$, where X is H or F, Y is H, F, or Cl, n is a number from 1 to 12, R is a carboxylic acid, an amide, a substituted amide, an amine, an alcohol, or an ester functionality, and N is 1 when R is not an alcohol or amine functionality, but N is 1, 2, or 3 when R is an alcohol or amine functionality. Chemical formulae used herein are intended to describe the nominal composition of a substance, whether or not it is so stated explicitly.

The inventive material combination comprises one, some, or all of the constituents of a multi-constituent liquid. The liquid according to the invention is a liquid that can form on a surface an adherent, substantially solid body. Inhibitors according to the invention are soluble in at least one of the constituents of the liquid to the extent necessary to result in a room temperature concentration of at least about 0.05%, by weight of the liquid, of dissolved inhibitor in the liquid.

Liquids according to the invention have reduced spreading tendency when in contact with solid surfaces, that is, they form and can maintain for at least some time a body having a shape substantially conforming to a predetermined geometry. The inhibitor present in a liquid according to the invention interacts with a surface in contact with the liquid, typically forming thereon a film, with the film-coated surface having a critical surface tension of wetting that is less than the surface tension of the inhibitor-containing liquid.

The invention can be advantageously practiced with adhesives, especially epoxy-containing adhesives. However, the practice of the invention is not restricted to adhesives, but can include, for instance, liquids comprising epoxies, polyesters, acrylics, or silicones.

The presence in a liquid according to the invention of an effective amount of inhibitor does not result in a substantial decrease of the surface tension of the liquid, typically by less than about 5 dynes/cm at room temperature. Also, the presence of inhibitor in a liquid according to the invention typically does not result in substantial deleterious changes in the properties of bodies produced from the liquid. In particular, adhesive bond strength, conductivity, or optical transparency are typically not substantially reduced.

The inventive material combination can either be the fully formulated multi-constituent liquid, or it can be one of the components of a multi-component system for forming the liquid by, e.g., mixing of the components. An example of the latter is a two-component epoxy system.

The inhibitor can be incorporated into the material combination in many different ways, and the scope of the inventive method is intended to be independent of the technique used for incorporation. Also, an inhibitor may or may not react with one or more constituents of the combination or of the liquid, and both possibilities are contemplated to be within the scope of the invention. And more than one inhibitor can be incorporated into the combination.

Liquids according to the invention, e.g., adhesives, can be mixed with solid constituents. In particular, the invention can be practiced advantageously with epoxy resins containing electrically conductive particles, e.g., silver powder or flake.

Preferred inhibitors are perfluorooctanoic acid (PFOA) and 1H, 1H-pentadecafluorooctyl amine (PDFOA). These inhibitors, for instance, typically prevent spreading of silver flake filled epoxy resins not only at or near room temperature, but also at elevated temperatures, typically up to at least about 175° C., for a time sufficient to allow curing of the resins.

DEFINITIONS

By "inhibitor" we mean herein a substance which, when present in a liquid in an effective amount, is capable of forming a film on a solid surface contacted by the liquid, with the thus coated surface having a critical surface tension of wetting that is less than the surface tension of the inhibitor-containing liquid. The term is intended to include substances which, when in contact with at least one constituent of the liquid, yield a reaction product which is capable of forming such a film.

By "body" we mean herein a sample of matter that substantially maintains its shape over time, regardless of whether the sample has one dimension that is much greater than the other two (e.g., part of a fine-line pattern), has two dimensions that are much greater than the other (e.g., a thin coating), or has three dimensions of comparable size (e.g., a transparent encapsulant of an LED chip). A body according to the above definition is herein also termed a "layer". The two terms are intended to be synonymous herein.

By "multi-constituent liquid" we mean a liquid, including a viscous liquid such as a paste, comprising more than one chemically distinct constituent present in amounts greater than trace amounts. As used herein, the term refers to the liquid composition of matter, e.g., a fully formulated epoxy adhesive, from which a surface-adhering solid body can be produced.

By "constituent" of a multi-constituent liquid we mean not only the compounds that make up a sample of the liquid but also these compounds prior to formation therefrom of the sample of liquid.

Terms such as "carboxylic acid", "amide", "substituted amide", "amine", "alcohol", and "ester", as well as, e.g., "epoxy resin", "polyester", "acrylic", and "silicone" are intended herein to have their commonly accepted meaning, as defined, for instance, in *Hackh's Chemical Dictionary*, 4th edition.

DETAILED DESCRIPTION

Inhibitors according to the invention are selected from the class nominally defined by the generic chemical formula $[CX_3—(CY_2)_n]_N—R$, in which all symbols have their usual meaning or were defined above. These compounds have a polar endgroup, the functional endgroup, which can attach to an appropriate solid surface. Furthermore, these compounds typically consist of linear chain molecules, with a relatively inert group, i.e., $CF_3$ or $CH_3$, occupying the nonpolar terminal position. Molecules of these compounds tend to form substantially monomolecular layers on appropriate surfaces, with the polar endgroup typically attached to the surface, and the molecules typically arranging themselves in more or less parallel and close-packed fashion. Coating of a surface with such a compound typically results in a surface having substantially lower critical surface tension of wetting than the uncoated surface, typically less than about 30 dynes/cm at room temperature, i.e., at about 20° C. Since most coating-forming liquids, e.g., adhesives comprising epoxy resins, have surface tensions at room temperature greater than about 30 dynes/cm, the class of compounds discussed above thus are potentially useful as inhibitors. Inhibitors according to the invention advantageously have relatively low vapor pressure, in order to avoid loss of the inhibitor from the liquid during curing or other processing steps.

Exemplary inhibitors according to the invention are 1H, 1H-pentadecafluorooctyl amine (PDFOA), perfluorooctanoic acid (PFOA), perfluorooctanamide (PFO amide), and pentadecafluorooctanol-1 (PDF octanol-1). The above listed exemplary compounds all have fluorinated chains. The following exemplary inhibitors all have hydrogenated chains: dodecylamine, octylamine, and nonylamine.

In the generic chemical formula given above, n determines the number of repeat units in the linear chain. The upper limit of n is typically determined by the onset of incompatibility of the inhibitor compound with the host liquid, or by the onset of surfactant action of the additive in the host. By "incompatibility" we mean herein insufficient solubility, and by "surfactant action" we mean a significant reduction in surface tension of the liquid. The above indicated considerations typically limit n to a value not exceeding about 12.

The lower limit of n in the above generic chemical formula is 1. In general, molecules of the class defined above having very short chain length, typically n of 1, 2, or 3, form layers in which the chains are insufficiently oriented to result in a sufficiently low-energy surface. However, under appropriate circumstances such short chain length molecules can be reacted with a constituent of the liquid to form a reaction product which may have the properties of an inhibitor. The preferred range of n is from about 4 to 12.

An example of an inhibitor that can react with a constituent of the liquid is PFOA. This compound can, for instance, be reacted with epoxy resin (or a mixture of epoxy resins) to form higher molecular weight adducts that act as inhibitor in the adhesive. The adducts formed in the reaction of PFOA with epoxy resins typically have relatively high molecular weight, e.g., about 700–1000, and consequently have relatively low volatility. As a consequence of this fact, even epoxies without filler, with PFOA as inhibitor, remain substantially nonspreading even at elevated temperatures. For instance, exemplary epoxy systems with 0.2% to 1% by weight of PFOA do not spread substantially when maintained at about 175° C. for a time long enough to result in curing of the adhesive, as will be illustrated in greater detail below.

Inhibitors according to the invention have substantial solubility in at least one of the constituents of the liquid, typically sufficient to result in an inhibitor concentration in the liquid of at least about 0.05% by weight of the liquid. When incorporated in an effective amount in the liquid, typically between about 0.05% and about 5% by weight of the liquid, inhibitors according to the invention can form a low-energy layer on appropriate solid surfaces. If the thus coated surface has a critical surface tension of wetting that is less than the surface tension of the inhibitor-containing liquid, the liquid does not spread on the surface, or its spreading tendency is substantially reduced.

At concentrations and/or solubility below about 0.05% the effectiveness of inhibitors according to the invention typically is substantially reduced, and such low concentrations and/or solubility thus are not recommended. And at concentrations above about 5% inhibitors typically have a substantial effect on, inter alia, the surface tension of the inhibitor-containing liquid. The effect on the surface tension is a lowering thereof, typically by more than about 5 dynes/cm at room temperature (i.e., at about 20° C.). For this and other reasons concentrations in excess of about 5% by weight of the liquid are not recommended.

The presence of an effective amount of inhibitor according to the invention does not result in a substantial deleterious change in relevant properties of a solid body produced from the inhibitor-containing liquid. For instance, a cured adhesive according to the invention typically has bond strength at most about 20% lower than that of the corresponding inhibitor-free adhesive. In particular, the presence of about 1% by weight of PFOA in an adhesive comprising three epoxy resins was found to have substantially no effect on the shear strength of bonds formed with this adhesive. Typically, a presence of more than about 5% by weight of inhibitor results in substantial deterioration of bond properties, e.g., bond strength.

The inhibitor may be incorporated into the potential material combination by well-known and conventional methods, e.g., by stirring, shaking, or ultrasonic dispersion. The combination can either be the otherwise fully formulated liquid, typically before addition to the liquid of solids such as conductive particles, or it can be a component of the liquid comprising one or more constituents of the liquid. The latter approach is, for instance, preferred for adding PFOA to epoxy adhesives. In this case, the required quantity of PFOA is prereacted with epoxy resin, or a mixture of epoxy resins, and the resulting product later added to the further constituents required to make up the fully formulated adhesive.

Addition of a small amount of coupling agent, that is, one of a well-known and commercially available group of compounds generally referred to as coupling agents, to inhibitor-containing liquids can have advantageous results. In particular, it can lead to enhanced inhibitor action. For instance, addition of the coupling agent N-beta(aminoethyl)-gamma-aminopropyl-trimethoxysilane to an epoxy adhesive that contains PFOA enhances the inhibitor action of PFOA substantially, as manifested by the observation that in the presence of this coupling agent a lower concentration of PFOA than in a similar adhesive not containing this coupling agent suffices to prevent spreading of the adhesive. Addition of the silane prior to addition of PFOA, however, typically does not result in enhanced inhibitor action and is not recommended.

The amount of inhibitor required to prevent the spreading of a given liquid on a given surface depends, inter alia, on the condition of the surface. For instance, the amount required typically increases with increasing surface roughness. Similarly, the amount of inhibitor required typically decreases with decreasing cleanliness of the surface. But the inventive method is most advantageously practiced on substantially clean surfaces, e.g., oxygen plasma cleaned surfaces. Inhibitor-containing liquids according to the invention can be used in a substantially similar manner as the corresponding inhibitor-free liquids. Methods for fabricating articles by use of the former thus are generally similar to the methods therefore by use of the latter, but typically do not include a separate fabrication step for preventing liquid spreading.

EXAMPLE I

A mixture of three commercial epoxy resins (an epoxy-novolac, a diglycidyl ether of resorcinol, and a diglycidyl ether of 1,4 butane diol) was thoroughly blended by conventional techniques. To 10 g of this mixture in a vial was added 0.2 g (2 phr, parts per hundred of resin) PFOA, the vial was stoppered and the mixture was shaken well until the PFOA (m.p. 59°–60° C.) was dissolved. The vial was placed in a 60° C. oven for approximately 15 minutes with occasional shaking. The resultant material was somewhat milky in appearance. To this solution was added 0.0275 mole/100 g (0.59 g) N-dimethylcarbamoyl-4-phenylimidazole (4$\phi$IM-U, a curing agent) and the mixture again shaken at 60° C. until the 4$\phi$IM-U was dissolved. Five small drops (about 0.5 mm diameter) of this adhesive were placed on a matt-finished gold-plated surface previously cleaned in an oxygen plasma. They did not measurably spread at room temperature (RT). The whole was then placed on a pre-heated aluminum plate in an oven at 175° C. Upon removal 10 minutes later the adhesive had hardened and the drops had approximately doubled in diameter but had preserved their approximate shape. Five drops of a similar adhesive not containing PFOA, treated in a similar manner, placed on a similar surface, spread to cover all of the available surface both at 175° and at RT.

EXAMPLE II

The procedure of Example I was repeated with the mixture of commercial epoxy resins used in Example I except that triglycidyl-p-amino phenol was substituted for the diglycidyl ether of resorcinol. This mixture, after addition of 2 phr PFOA and heating, was also milky in appearance but had a light pink color. Five drops of this mixture was also tested for spreading, with results similar to that given above. A similar mixture without PFOA, as before, spread at RT and at 175° C.

EXAMPLE III

The above procedures were repeated with a mixture of four commercial epoxy resins (a diglycidyl ether of bisphenol A, a triglycidyl-p-amino phenol, a tetraglycidyl methylene dianiline and a diglycidyl ether of neopentyl glycol). This mixture, after addition of 2 phr PFOA and heating, was clear with a distinct pink color. To 10 g of this mixture were added 0.007 mole/100 g (0.15 g) of 4$\phi$IM-U and 7 phr dicyandiamide (micropulverized) as a curing agent. Dispersion of the dicyandiamide was achieved by first grinding the liquid mixture with a mortar and pestle and then thoroughly mixing it with a spatula on a flat quartz plate. The mixture containing PFOA, tested as above at 175° C. and at RT, did not spread. A similar mixture without PFOA spread both at 175° C. and at RT.

EXAMPLE IV

To a very fluid mixture of three commercial epoxy resins (a diglycidyl ether of bisphenol A, a triglycidyl-p-amino phenol, and a diglycidyl ether of 1,4 butane diol) was added 1 phr PFOA and heated as above. To 10 g of this mixture was added 0.0275 mole/100 g. (0.52 g) of a commercial grade of 2-phenyl-4-methyl-5-hydroxymethyl imidazole which was dispersed in the liquid by grinding with a mortar and pestle. To this mixture was added 12.8 g of a silver flake which was dispersed by stirring and lightly mixing with a spatula on a flat quartz plate. This gave a material 55% by weight of silver flake. This electrically conductive adhesive was tested for spreading ("bleeding") as before at 175° C. There was only very slight bleeding (a fraction of a millimeter). The same adhesive, without PFOA, exhibited bleeding, i.e., the extensive spreading of a thin film of liquid component of the mixture over the gold surface to a distance several millimeters away from the periphery of the drops. At RT, the uncured adhesive with PFOA showed no evidence of bleeding. The uncured adhesive without PFOA showed extensive bleeding even at RT.

EXAMPLE V

To the mixture of commercial epoxy resins and curing agent in Example I was added 1 phr of pentadecafluorooctyl amine (PDFOA). To 10 g of this mixture was added 25.7 g of a silver flake which was dispersed by stirring and lightly mixing with a spatula on a flat quartz plate. This gave a material 72% by weight of silver flake. This electrically conductive adhesive was tested for "bleeding" as for Example IV at 175° C. Bleeding was absent or very slight (a fraction of a millimeter). The same adhesive, without PDFOA, exhibited extensive bleeding, up to several millimeters away from the periphery of the drops.

EXAMPLE IV

An adduct (1/2, acid equivalent/epoxy equivalent) of PFOA and a commercial epoxy resin (a diglycidyl ether of neopentyl glycol, epoxy equivalent ~145) was prepared by dissolving, at room temperature, 5.0 g of PFOA in 3.5 g of the epoxy resin, in a closed vial, with shaking. The mixture first became cool as the PFOA dissolved and then hot to the touch as the acid and epoxy reacted to form an ester. Within fifteen minutes the reaction was complete, as revealed by the infrared spectrum of the resulting liquid.

The experiment given in Example III was repeated with an adhesive containing 1 phr of the adduct described above. It was tested at RT and 175° C., as before, for bleeding. It showed no spreading at RT but significant spreading at 175° C., though it did not spread over the entire gold plate. One phr of N-beta(aminoethyl)-gamma-aminopropyl-trimethoxysilane (AATS), a common coupling agent, was added to the mixture which was again tested for spreading. The adhesive containing the adduct and AATS showed no evidence of spreading.

EXAMPLE VII

The experiment given in Example III was repeated with an adhesive containing 0.2 phr PFOA. At 175° C., the liquid spread over the freshly plasma cleaned gold plate. One phr of AATS was then added to the adhesive containing 0.2 phr PFOA and shaken to mix thoroughly. The pink color of the adhesive changed to light yellow. This material, containing PFOA and AATS in the concentrations given above, did not spread at 175° C. or at RT. The same material containing 1 phr AATS but no PFOA spread over the gold plate at 175° C., and at RT.

EXAMPLE VIII

To various commercial epoxy resins or mixtures of commercial epoxy resins, were added (a) 1 phr dodecylamine, (b) 0.12 phr octylamine, (c) 5 phr octylamine, (d) 1 phr nonylamine, (e) 0.5 phr PDFO amide, (f) 1.0 phr PDF octanol-1. The liquids were tested for spreading at RT. None of the samples were found to spread substantially on a plasma-cleaned matt-finished gold surface.

1 phr perfluorotributylamine or 1 phr of pentafluoropropylamine, added to a commercial epoxy resin (Epon 825, Shell Chemical Company), did not prevent spreading of the liquid on plasma-cleaned matt-finished gold surfaces at RT.

The inhibitors used in (a), (b), (c), (d), and (f) may result in substantial viscosity increases of epoxy resins stored for an extended period of time, or may, in conjunction with curing agents, catalyze the curing reaction.

EXAMPLE IX

To 100 parts by weight (pbw) of Bio-Plastic, (a proprietary styrene-containing polyester resin, available from Ward's Natural Science Establishment, Inc., Rochester, N.Y.), was added 2 pbw of PFOA and the mixture was warmed at 60° C. in a closed glass container. The container was occasionally shaken to facilitate dissolution of the PFOA, which dissolved quite rapidly. The solution was then allowed to cool. To 5 g of the above mixture was added 0.1 g of methylethylketone peroxide as a curing catalyst. Drops of this mixture were placed on freshly oxygen-plasma cleaned gold plate and the whole placed in a 60° C. oven for 15 minutes and then in a 95° C. oven for a further 15 minutes. Visual examination after removal showed that the drops had substantially retained their size and shape. Drops of similarly catalyzed resin not containing PFOA, similarly cured, had substantially changed size and form, and were surrounded by a thin film or halo of spread material.

EXAMPLE X

To each of 100 pbw of parts A and B of Sylgard 170 (a proprietary silicone elastomer available from Dow Corning, Midland, Mich.) were added 2 pbw of PDFOA, which was thoroughly dispersed by heating in a closed glass container to 60° C. and shaking. On cooling, equal parts (by weight) of A and B were combined and stirred thoroughly to mix. Drops of this black mixture were placed on freshly oxygen-plasma cleaned gold plate and the whole placed in an oven to cure at 95° C. for one-half hour. Visual examination after removal showed that the drops had substantially retained their shape and size, and that there was no bleeding. Equal parts of A and B not containing PDFOA were similarly mixed and drops of that mixture placed on similar gold plate. The drops immediately spread to form a thin film on the gold surface, and a small halo of clear material was visible around the drops. After curing for one-half hour in an oven at 95° C., the halo had further increased in size.

EXAMPLE XI

Under the same conditions as given for Example IX, but with the liquid containing 1.5 pbw nonadecafluorodecyl amine (NDFDA) instead of 2 pbw of PFOA, results substantially identical to those given in Example IX were obtained.

What is claimed is:

1. Method for producing an article, the method comprising producing, from a substance comprising a multi-constituent liquid, on an existing surface, a layer having a shape substantially conforming to a predetermined geometry, the liquid being an adhesive or a liquid comprising a component selected from the group consisting of epoxies, polyesters, acrylics, and silicons, the liquid also comprising an effective amount of a material herein designated inhibitor, the inhibitor being capable of forming a film on the surface, with the film-coated surface having a critical surface tension of wetting that is less than the surface tension of the inhibitor-containing liquid, characterized in that
   (a) the layer produced from the liquid is at room temperature an adherent, substantially solid layer,
   (b) the inhibitor is selected from the class defined by the formula $[CX_3-(CH_2)_n]_N-R$, where X is H or F, Y is H, F, or Cl, n is a number from 1 to 12, R is a carboxylic acid, an amide, a substituted amide, an amine, an alcohol, or an ester functionality, and N is 1 when R is not an alcohol or amine functionality, but N is 1, 2, or 3 when R is an alcohol or amine functionality, and
   (c) the inhibitor is soluble in at least one of the constituents of the liquid to the extent necessary to result in a concentration of at least about 0.05%, by weight of the liquid, of dissolved inhibitor in the liquid.

2. Method of claim 1, wherein X is F.

3. Method of claim 2, wherein Y is F.

4. Method of claim 3, wherein n is greater than 3.

5. Method of claim 4, wherein the liquid contains between about 0.05% and about 5%, by weight of the liquid, of inhibitor.

6. Method of claim 5, wherein R is a carboxylic acid functionality or an amine functionality.

7. Method of claim 6, wherein the liquid is an adhesive comprising an epoxy resin.

8. Method of claim 7 wherein the inhibitor comprises perfluorooctanoic acid or 1H, 1H-pentadecafluorooctyl amine.

9. Method of claim 5, wherein the combination comprises a curing agent.

10. Method of claim 5, wherein the combination comprises a coupling agent.

11. Method of claim 10, wherein the coupling agent is N-beta(aminoethyl)-gamma-aminopropyl-trimethoxysilane.

12. Method of claim 5, wherein the substance comprises a solid constituent.

13. Method of claim 12, wherein the solid constituent consists substantially of electrically conductive particles.

14. Method of claim 13, wherein the conducting particles are silver particles.

15. Method of claim 7, wherein the inhibitor is added to the epoxy resin prior to adding at least one further constituent thereto.

16. Method of claim 15, wherein the inhibitor comprises perfluorooctanoic acid.

17. Method for producing an article comprising a component bonded to a substrate, the method comprising contacting at least a part of the substrate surface with a multi-constituent adhesive comprising at least one epoxy resin and between 0.05% and about 5% by weight of an inhibitor, with the inhibitor comprising perfluorooctanoic acid, or 1H, 1H-pentadecafluorooctyl amine, the method further comprising applying the component to the adhesive-covered substrate surface.

18. Method of claim 17, wherein the adhesive comprises a conductivity component, and the inhibitor consists substantially of perfluorooctanoic acid.

19. Method of claim 18, wherein the perfluorooctanoic acid is added to the epoxy resin prior to adding at least one further constituent of the adhesive thereto.

20. Method of claim 19, wherein the adhesive further comprises N-beta(aminoethyl)-gamma-aminopropyltrimethoxysilane.

21. Article produced by the method of claim 7, 1, or 17.

22. Method of claim 17 wherein the component bonded to a substrate is a semiconductor component.

23. Method of claim 17, further comprising a step for thermally curing, at a temperature above room temperature, the multi-constituent adhesive, the step being carried out subsequent to contacting the substrate with the adhesive.

* * * * *